United States Patent [19]
Ashizaki et al.

[11] Patent Number: 4,831,344
[45] Date of Patent: May 16, 1989

[54] IC OUTPUT CIRCUIT FOR USE IN PULSE WIDTH MODULATOR

[75] Inventors: Yoshihiro Ashizaki; Kazuyuki Takada, both of Hirakata, Japan

[73] Assignee: Matsushita Electric Industrial Co., Ltd., Osaka, Japan

[21] Appl. No.: 141,223

[22] Filed: Jan. 6, 1988

[30] Foreign Application Priority Data

Jan. 8, 1987 [JP] Japan ................................. 62-2366

[51] Int. Cl.[4] ............................................. H03K 7/08
[52] U.S. Cl. .................................... 332/9 T; 318/599
[58] Field of Search .......................... 332/9 T; 375/22; 318/599, 684; 363/26, 41; 370/9

[56] References Cited

U.S. PATENT DOCUMENTS 4,081,731 3/1978 Wesner ................................. 318/599
4,654,566 3/1987 Erdman ........................... 318/599 X Primary Examiner—Siegfried H. Grimm
Attorney, Agent, or Firm—Wenderoth, Lind & Ponack

[57] ABSTRACT

According to the present invention, an output transistor on the power supply side Vcc is composed of an NPN type transistor whose base is driven by a PNP type transistor with a diode in its collector-to-emitter path to prohibit its saturation. Another output transistor on the power supply side GND is similarly composed of an NPN type transistor. The above two drive circuits are combined to set up an output circuit for pulse width modulation.

3 Claims, 4 Drawing Sheets

IC OUTPUT CIRCUIT FOR USE IN PULSE WIDTH MODULATOR

BACKGROUND OF THE INVENTION

1. Field of the Invention

This invention relates to an IC circuit for use in the pulse width modulator for motor drive circuitry such as the one in office or industrial equipment, which may be implemented with bipolar process ICs.

2. Description of the Related Art

The conventional servo motor for use in office equipment or the like is driven through a drive circuitry illustrated in FIG. 6, wherein the motor 55 is rotationally driven through an output circuit 54 in a pulse width modulation drive system 53 in response to speed instruction signals externally applied to the drive system 53 through a terminal 52. Rotation of the motor 55 is under control by energization sensor signals 56 sensed from the motor 55 and fed back to the drive system 53. The output circuit of a pulse width modulation drive system is usually a discrete circuit due to its simplicity in circuit arrangement. An example of such discrete output circuit of pulse width modulation is illustrated in FIG. 4 and discussed referring to FIG. 4.

Referring to FIG. 4, the base of a transistor 29 is connected to the collector of a transistor 31 and to the collector of a transistor 30 through a resistor 35, with the base of the transistor 30 being connected to a power supply line 49 through a resistor 36 and to a terminal 45. The base of the transistor 31 is connected to a terminal 46 through a resistor 37 and to the power supply line 49 through a resistor 41. The emitters of the transistors 29 and 31 are connected to the power supply line 49, while the counterpart of the transistor 30 is connected to another power supply line 50.

The base of a transistor 32 is connected to the collector of a transistor 34 directly and to the collector of a transistor 33 through a resistor 38, while the base of the transistor 34 is connected to the power supply line 49 through a resistor 39 and to a terminal 48. The base of the transistor 33 is connected to a terminal 47 via a resistor 40 and to the power supply line 49 via a resistor 42. The emitters of the transistors 32 and 34 are connected to the power supply line 50, with the emitter of the transistor 33 being connected to the power supply line 49.

The collectors of the transistors 29 and 32 are led together to a terminal 51 which serves as the output terminal of this circuit arrangement. Connected to the output terminal 51 is the anode of a diode 43 whose cathode is connected to the power supply line 49. The anode of another diode 44 is connected to the power supply line 50, with its cathode being connected to the output terminal 51. It is noted that the transistors 29, 31 and 33 are of the PNP type and the transistors 30, 32 and 34 are of the NPN type.

The circuit arrangement as discussed above will work as follows: The terminals 45, 46, 47 and 48 receive signals as shown in FIG. 5. At time (a), the circuit arrangement assumes the following operation mode. When a High signal is applied to the terminal 45, the transistor 30 turns ON and the transistor 29 also turns ON. The potential Vout at the output terminal 51 increases to the level corresponding to the potential in the power supply line 49 (leading to Vcc) minus the saturation voltage Vce (sat) of the transistor 29.

$$V_{out} = V_{cc} - V_{ce}(sat)$$

On the other hand, the transistor 33 turns OFF with no supply of current to the base of the transistor 32, since a High signal has been applied to the terminal 47. Further, because the High signal has also been applied to the terminal 48, the transistor 34 turns ON to short the base-to-emitter path of the transistor 32 and turns OFF the transistor 32.

At time (b), the terminal 45 receives a Low signal to turn OFF the transistor 30, with no current supply to the base of the transistor 29 as a consequence. The terminal 46 also receives a Low signal, so that the transistor 31 turns ON to short the base-to-emitter path of the transistor 29 and turn OFF the transistor 29 instantaneously.

On the other hand, the transistor 32 remains OFF because the terminals 47 and 48 assume the same status as at time (a). At time (c), a Low signal is applied to the terminal 47 to turn ON the transistor 33 with a current supply to the base of the transistor 32 as a consequence. The terminal 48 receives a Low signal, so that the transistor 34 turns OFF, with the base-to-emitter path of the transistor 32 brought into open state. The result is that the transistor 32 turns ON. The transistor 29 remains OFF because the terminals 45 and 46 are in the same state as at time (b). In this situation, the potential at the output terminal 51 equals the saturation voltage Vce (sat) of the transistor 32.

$$V_{out} = V_{ce}(sat)$$

At time (d), the terminal 47 receives a High signal to turn OFF the transistor 33 with no current supply to the base of the transistor 32. The terminal 48 also receives a High signal, so that the transistor 34 turns ON to short the base-to-emitter path of the transistor 32 and turn OFF the transistor 32 immediately.

It is clear from the above explanation that there is a certain period of time during which both the transistors 29 and 32 are OFF, that is, a break period where current is prevented from flowing through the transistors 29 and 32. The diodes 43 and 44 are flywheel diodes which form a circuit for discharging the energy stored in the wiring while the output terminal 51 is loaded with an inductance. For example, when output current is flowing out of the output terminal 51, current is flowing through the power supply line 49, transistor 29, output terminal 51 and inductance load while the transistor 29 is ON. In this condition, if the transistor 29 is turned OFF, current will tend to continue flowing out of the output terminal 51 due to the inductance load. At this moment, however, the diode 44 turns ON, permitting current to flow through the power supply path 50 and the output terminal 51 and the inductance load. If current flows into the output terminal 51, the transistor 32 will turn OFF and the diode 43 will turn ON.

The above circuit arrangement faces difficulties when it is to be implemented as an IC device in that the transistor 29 on the side of the output terminal 51 is of the PNP type with a smaller current capacity per unit area than the NPN type and must have a larger chip area in order to meet the requirement of a current flow between 1 and 2 amperes. Further, due to the use of the transistor 32 of the NPN type on the side of the output terminal 51 which is different in type from that of the transistor 29, the circuit arrangement presents another problem in that differences in current amplification factor $h_{EF}$ and switching speed make it difficult to balance the circuit arrangement.

SUMMARY OF THE INVENTION

The primary object of the present invention is to provide an IC output circuit for use in the pulse width modulator, which may be reduced into a smaller IC area.

Another object of the present invention is to provide an IC output circuit for pulse width modulation in which current flowing therethrough can be decreased to improve its response.

According to the present invention, the above objects are accomplished by providing an IC output circuit for pulse width modulation which comprises a first circuit and a second circuit, said first circuit comprising first through third transistors and said second circuit comprising fourth through seventh transistors, wherein the base of said first transistor of the NPN type in said first circuit is connected to the collector of said second transistor of the PNP type whose base is connected to the collector of said third transistor, the base of said third transistor is connected to a first terminal through a first resistor and to a first power supply terminal through a second resistor, the base of said second transistor is connected to the anode of a first diode, said first diode prohibiting said second transistor from going into saturation state, the collector of said second transistor is connected to the anode of a second diode, said second diode prohibiting said second transistor from going into saturation state, the cathodes of said first and second diodes being connected together to a second terminal through a third resistor, the collector of said first transistor and the emitters of said second and third transistors are connected to said first power supply line, and a fourth resistor is connected between the base and emitter of said first transistor, wherein the base of said fourth transistor of the NPN type is connected to the emitter of said fifth transistor and the collector of said fourth transistor is connected to the collector of said fifth transistor, the base of said fifth transistor is connected to the collector of said sixth transistor whose collector is connected to the collector of said seventh transistor through a fifth resistor, the base of said seventh transistor is connected to a fourth terminal through a sixth resistor and to said first power supply line through a seventh resistor, the base of said sixth transistor is connected to a third terminal and to said first power supply line through an eighth resistor, the emitter of said seventh transistor is connected to said first power supply line and the emitters of said fourth and sixth transistors are connected to a second power supply line, and a ninth resistor is connected between the base and emitter of said fourth transistor and a tenth resistor is connected between the base and emitter of said fifth transistor, wherein said first and second circuits are connected by connecting the emitter of said first transistor to the collector of said fourth transistor and an output terminal for the whole circuit arrangement is led from that junction.

DESCRIPTION OF THE PREFERRED EMBODIMENTS

Figure 1:
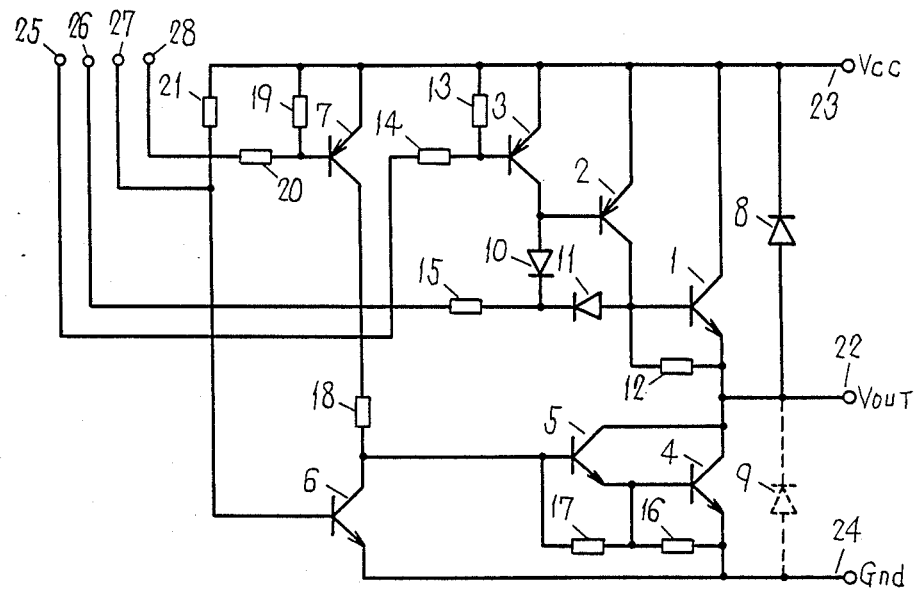
FIG. 1 is a wiring diagram of an IC output circuit for pulse width modulation according to an embodiment of the present invention.

In FIG. 1, there is illustrated a wiring diagram of an output circuit for pulse width modulation according to an embodiment of the present invention. Referring to FIG. 1, the base of a first transistor 1 of the NPN type is connected to the collector of a second transistor 2 of the PNP type whose base is connected to the collector of a third transistor 3. The base of the transistor 3 is connected to a first terminal 25 through a first resistor 14 and to a first power supply line 23 through a second resistor 13. Connected to the base of the transistor 2 is the anode of a first diode 10, the first diode preventing the transistor 2 from plunging into the saturation state. Connected to the collector of the transistor 2 is the anode of a second diode 11 which prevents the transistor 2 from plunging into the saturation state. The cathodes of the diodes 10 and 11 are connected together to a second terminal 26 through a third resistor 15. The collector of the transistor 1 together with the emitters of the transistors 2 and 3 is connected to the power supply line 23. In addition, the base of a fourth transistor 4 of the NPN type is connected to the emitter of a fifth transistor 5, with the collector of the transistor 4 being connected to the collector of the transistor 5. The base of the transistor 5 is connected to the collector of a sixth transistor 6 which has its collector connected to the collector of a seventh transistor 7 through a fifth resistor 18. The base of the seventh transistor 7 is connected to a fourth terminal 28 by way of a sixth resistor 20 and to the power supply line 23 through a seventh resistor 19. The base of the transistor 6 is connected to a third terminal 27 and to the power supply line 23 through an eighth resistor 21. The emitter of the transistor 7 is connected to the power supply line 23, while the counterparts of the transistors 4 and 6 are connected to a second power supply line 24. The emitter of the transistor 1 and the collector of the transistor 4 are connected together to set up an output terminal 22.

There are further provided a fourth resistor 12 between the base and collector of the transistor 1, a ninth resistor 16 between the base and emitter of the transistor 4, and a tenth resistor 17 between the base and emitter of the transistor 5.

It is further noted that the output terminal 22 is connected to the anode of a third diode 8 whose cathode is connected to the power supply line 23. The output terminal 22 is further connected to the cathode of a fourth diode 9 whose anode is connected to the power supply line 24.

Figure 2:
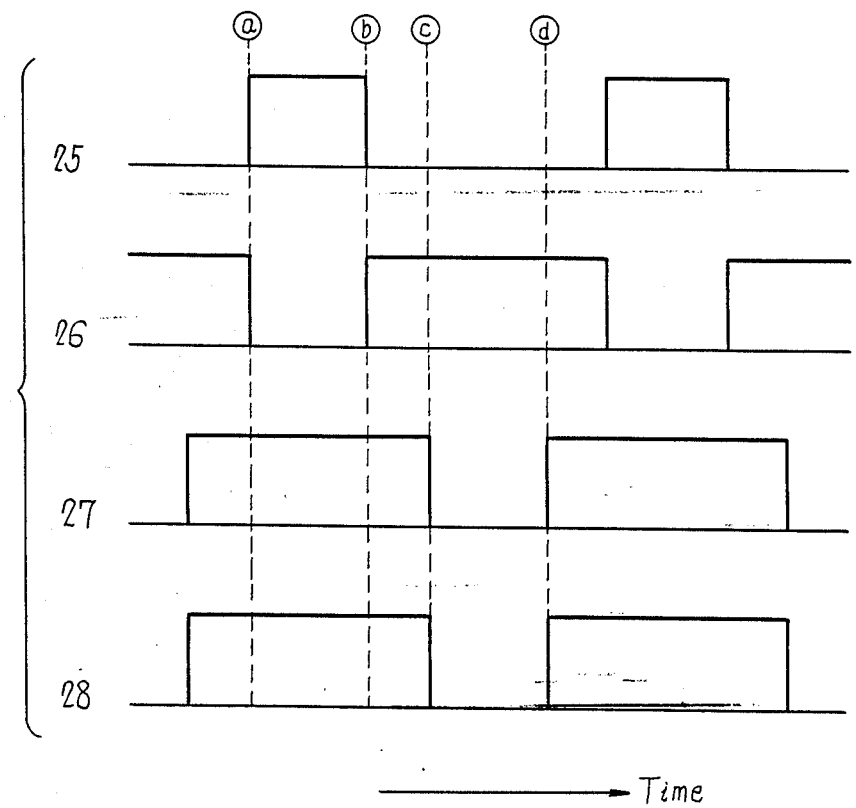
FIG. 2 a timing chart of signal waveforms applied to input terminals as shown in FIG. 1.

The above arrangement according to the embodiment of the present invention will operate as follows: In FIG. 2, there is illustrated a timing chart of input signals applied to the input terminals 25, 26, 27 and 28 of FIG. 1.

At time (a), the terminal 26 is Low so that the diodes 10 and 11 and the transistor 2 turn ON. Thus, current is fed to the base of the transistor 1 to turn ON the transistor 1. The potential Vout at the output terminal 22 is as follows where Vce (sat) is the saturation voltage of the transistor 1.

$$V_{out} = V_{cc} - V_{ce} \text{ (sat)}$$

Because the terminal 28 is High, the transistor 7 is OFF with no current supply to the base of the transistor 5. Further, because the terminal 27 is High, current is fed to the base of the transistor 6 through the resistor 21 to turn ON the transistor 6 and short the path between the base of the transistor 5 and the emitter of the transistor 4 and turn OFF the transistor 4.

At time (b), the terminal 26 is High so that the diodes 10 and 11 turn OFF with no supply of current to the base of the transistor 2. The terminal 25 at Low level renders the transistor 3 ON to short the base-to-emitter path of the transistor 2.

Accordingly, the transistor 2 turns OFF and so does the transistor 1. The transistor 4, however, remains OFF because the terminals 27 and 28 assume the same state.

At the subsequent time (c), the terminal 28 is Low and the transistor 7 turns ON. The terminal 27 is also Low and the current which is flowing through the resistor 21 begins to flow completely into the terminal 27, thus turning OFF the transistor 6. As a result, the base of the transistor 5 is supplied with current, so that the transistors 5 and 4 turn ON. The potential Vout at the output terminal 22 at this moment is as follows where Vce (sat) is the collector-to-emitter voltage of the transistor 4:

$$V_{out} = V_{ce} \text{ (sat)}$$

However, the transistor 1 remains OFF because the signals to the terminals 25 and 26 are the same as at time (b).

The terminals 27 and 28 are High at time (d), so that the transistor 4 turns OFF as mentioned previously. With such arrangement, the transistors 1 and 4 are of the NPN type with the advantage of larger output current. Both the transistors are formed in the IC simultaneously so that they have identical characteristics and no design difficulty is experienced in setting break periods from (b) to (c) and from (d) to (a).

In the case where the output current is large, the transistor 2 of the PNP type should occupy a larger emitter area due to the inability of the transistor 1 to take a higher current amplification factor $h_{FE}$ for pulse operation. The emitter area can be saved substantially as compared with the case where the transistor 1 is of the PNP type. For instance, the area of the NPN transistor with a maximum current of approximately 1.5 A is $70 \times 10^4$ μm², whereas that of the PNP transistor is approximately $32 \times 10^4$ μm². Therefore, it is thus possible to reduce the area of the IC chip when the circuit arrangement is implemented with IC.

Figure 3:
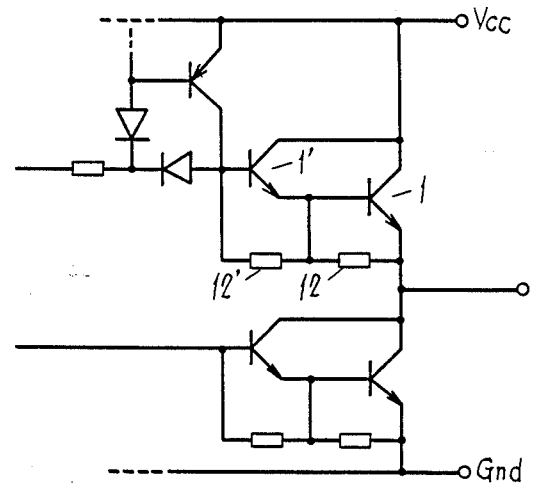
FIG. 3 is a wiring diagram of a part of the output circuit according to another embodiment.
Figure 4:
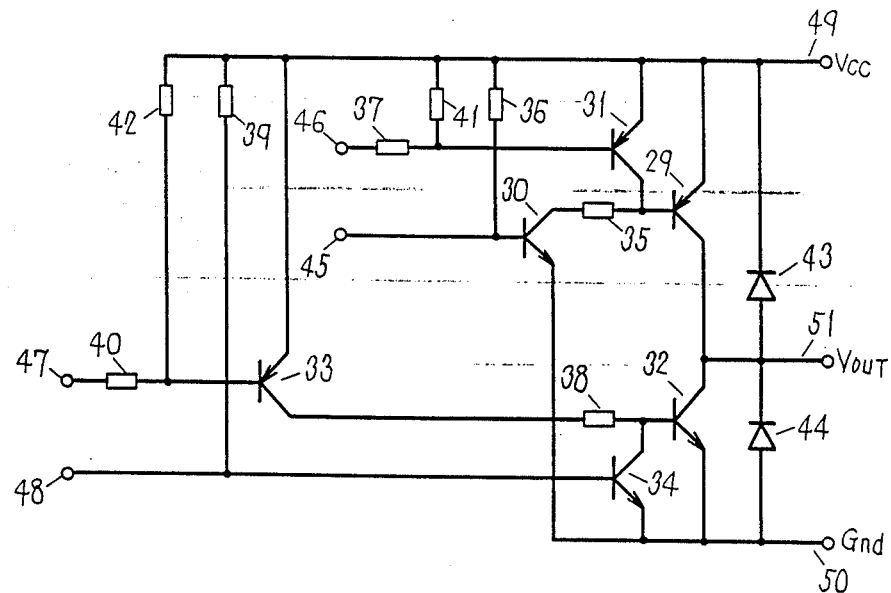
FIG. 4 is a wiring diagram of a conventional output circuit for pulse width modulation implemented with a discrete circuit.
Figure 5:
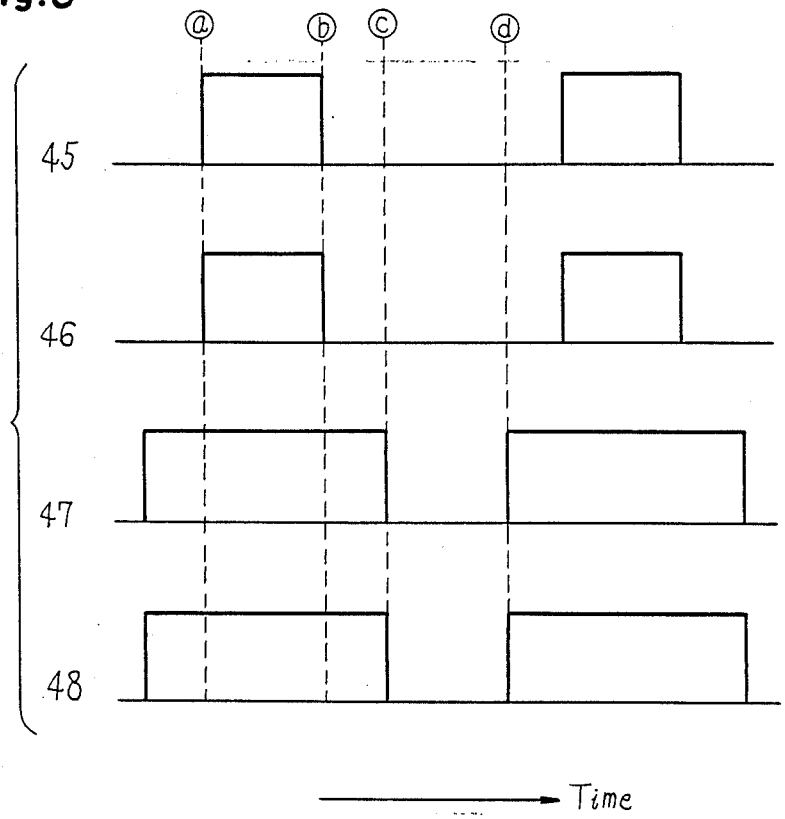
FIG. 5 is an input waveform diagram for the circuit of FIG. 4.
Figure 6:
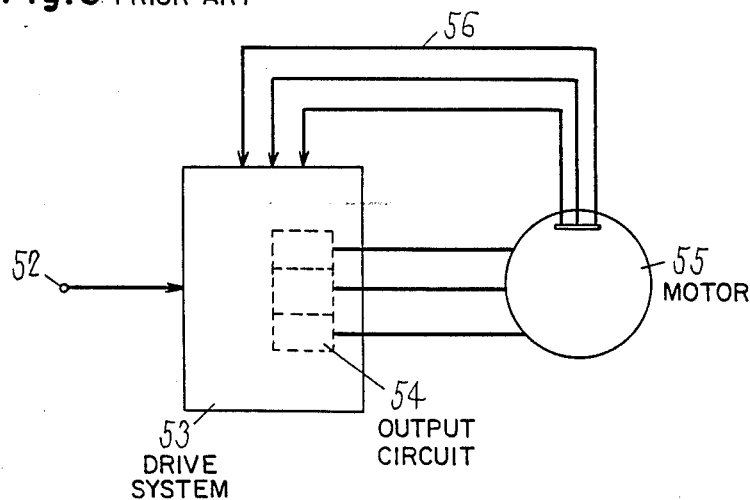
FIG. 6 is a block diagram of a drive system of pulse width modulation.

In the event the transistor 2 is deeply saturated in turning from ON to OFF, it will take a long time for the same in switching from OFF to On. To this end the diodes 10 and 11 are used which prevent the collector-to-emitter voltage of the transistor 2 from going below 0.7 V or the transistor 2 from plunging into the saturation state. With the above circuit design, it becomes possible to keep the switching delay time of the transistor 1 or the switching delay time of the transistor 2 within the order of 1 μsec and improve response when the circuit arrangement is, in fact, pulse width modulated at about 40 KHz. In the foregoing circuit arrangement, the transistors 4 and 5 are wired in a Darlington configuration. However, in the embodiment of FIG. 3, in which the transistor 1 and resistor 12 are replaced by Darlington transistors 1 and 1' and resistors 12 and 12', the parasitic capacitance between the base and emitter of the transistor 1' in the circuit of FIG. 3 turns the transistor 1' ON and allows current easy to easily flow between the transistors 1 and 4 when the output terminal voltage changes from Vcc−Vce (sat) to Vce (sat). The illustrated embodiment of FIG. 1, therefore, avoids the problem by using an increased emitter area of the transistor 2 rather than the Darlington connection of transistors 1 and 1'.

Though the diode 8 is incorporated into the IC in the form of a flywheel diode, it is necessary to connect it outside of the IC due to the internal resistance in the IC to current flow when the output current is high. Moreover, in the case of the diode 9, it is not desirable that it be formed inside the IC because of the possibility of the output terminal voltage becoming lower than Gnd and the consequent formation of a parasitic transistor. This diode is connected externally of the IC and, as a preferred example, may be a schottky barrier diode with a forward voltage of less than 0.7 V.

What is claimed is:

1. An IC output circuit for pulse width modulation which comprises a first circuit and a second circuit, said first circuit comprising first through third transistors and said second circuit comprising fourth through seventh transistors, wherein the base of said first transistor of the NPN type in said first circuit is connected to the collector of said second transistor of the PNP type whose base is connected to the collector of said third transistor, the base of said third transistor is connected to a first terminal through a first resistor and to a first power supply terminal through a second resistor, the base of said second transistor is connected to the anode of a first diode, said first diode preventing said second transistor from going into saturation state, the collector of said second transistor is connected to the anode of a second diode, said second diode preventing said second transistor from going into saturation state, the cathodes of said first and second diodes being connected together to a second terminal through a third resistor, the collector of said first transistor and the emitters of said second and third transistors are connected to said first power supply line, and a fourth resistor is connected between the base and emitter of said first transistor, wherein the base of said fourth transistor of the NPN type is connected to the emitter of said fifth transistor and the collector of said fourth transistor is connected to the collector of said fifth transistor, the base of said fifth transistor is connected to the collector of said sixth transistor whose collector is connected to the collector of said seventh transistor through a fifth resistor, the base of said seventh transistor is connected to a fourth terminal through a sixth resistor and to said first power supply line through a seventh resistor, the base of said sixth transistor is connected to a third terminal and to said first power supply line through an eighth resistor, the emitter of said seventh transistor is connected to said first power supply line and the emitters of said fourth and sixth transistors are connected to a second power supply line, and a ninth resistor is connected between the base and emitter of said fourth transistor and a tenth resistor is connected between the base and emitter of said fifth transistor, wherein said first and second circuits are connected by connecting the emitter of said first transistor to the collector of said fourth transistor and an output terminal for the whole circuit arrangement is led from that junction.

2. An IC output circuit for pulse width modulation according to claim 1 wherein a high level signal is applied to said second terminal when a signal applied to said first terminal is at a low level, a low level signal is applied to said second terminal when a signal applied to said first terminal is at a high level, and wherein the signals applied to said third and fourth terminals remain at high level during the period from the time where the signal applied to said second terminal assumes a low level to the time where the same resumes a high level.

3. An IC output circuit for pulse width modulation according to claim 1 wherein there are further provided a third diode having its anode connected to said output terminal and its cathode connected to said first power supply line and a fourth diode having its cathode connected to said output terminal and its anode connected to said second power supply line.

* * * * *